(12) United States Patent
Ozawa

(10) Patent No.: US 6,229,167 B1
(45) Date of Patent: May 8, 2001

(54) SEMICONDUCTOR DEVICE AND METHOD OF MANUFACTURING THE SAME

(75) Inventor: Takanori Ozawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/274,887

(22) Filed: Mar. 23, 1999

(30) Foreign Application Priority Data

Mar. 24, 1998 (JP) .................................................. 10-075904

(51) Int. Cl.$^7$ .......................... H01L 27/108; H01L 29/76; H01L 29/94; H01L 31/119
(52) U.S. Cl. ........................... 257/295; 257/296; 257/300; 257/532
(58) Field of Search ..................................... 257/295, 296, 257/300–310, 412–414, 532–535; 438/3, 240, 655

(56) References Cited

U.S. PATENT DOCUMENTS

| | | | |
|---|---|---|---|
| 5,475,248 | * 12/1995 | Takenaka | 257/295 |
| 5,578,867 | * 11/1996 | Argos, Jr. et al. | 257/295 |
| 5,580,814 | * 12/1996 | Larson | 438/3 |
| 5,624,864 | * 4/1997 | Arita et al. | 438/3 |
| 5,627,391 | * 5/1997 | Shimada et al. | 257/310 |
| 6,022,774 | * 2/2000 | Kawai et al. | 438/3 |

* cited by examiner

Primary Examiner—Steven Loke
Assistant Examiner—Cuong Q Nguyen
(74) Attorney, Agent, or Firm—Morgan, Lewis & Bockius LLP

(57) ABSTRACT

In a ferroelectric memory and a method of manufacturing it, a metallic layer 30 of Ni, which is silicified at a temperature lower than the temperature when a ferroelectric layer FL looses ferroelectricity non-reversibly, is formed so as to be partially brought into contact with the upper surface of one of the source/drain regions 26. Thereafter, the metallic layer 30 is; heated at the temperature lower than the temperature when the ferroelectric layer FL looses the ferroelectricity non-reversibly. Thus, the metallic layer 30 is silicified to form a silicide layer 31. Therefore, without deteriorating the function of the ferroelectric layer FL, the portion of the metallic layer 30 which is contact with the upper surface of the source/drain region 26 can be sufficiently silicified. Ni has a very weak reduction/catalysis function for the ferroelectric layer FL. Therefore, the metallic layer 30 not silicified does not adversely affect the ferroelectric layer FL in the post manufacturing steps. Thus, the semiconductor device can give a small connection resistance between a silicon layer and a wiring layer while holding the function of a ferroelectric layer.

12 Claims, 8 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing it, and more particularly to a semiconductor device having a ferroelectric layer and a method of manufacturing such a device.

2. Description of the Related Art

As a semiconductor device having a ferroelectric layer, a ferroelectric memory is previously known. FIGS. 14 and 15 partially show the sectional structure of a conventional ferroelectric memory. The ferroelectric memory includes a ferroelectric capacitor FC composed of a ferroelectric film FL and a lower electrode LE and an upper electrode UE sandwiching the ferroelectric film therebetween, a MOSFET, etc. The ferroelectric memory has been manufactured in the following manner.

First, as seen from FIG. 14, a field oxide film 4 for element isolation is formed on a semiconductor substrate 2. A MOSFET is formed within an element region encircled by the field oxide film 4. In this figure, an $N^+$ diffused layer 6 (source regionor drain region) is present on a P-type Si substrate surface. On the $N^+$ diffused layer 6, a ferroelectric capacitor FC is formed through an interlayer insulating film 8. The ferroelectric capacitor FC has a structure in which the lower electrode LE, ferroelectric layer FL and upper electrode UE are stacked in this order.

Contact holes 18a and 18b are formed in the interlayer insulating film 8. The contact hole 18a is formed so as to reach the $N^+$ diffused layer 6. The contact hole 18b is formed to reach the upper electrode UE of the ferroelectric capacitor FC.

As seen from FIG. 15, on the resultant surface, a titanium (Ti) layer 10, a barrier metal layer 12 of titanium nitride (TiN), an aluminum wiring layer 14 and a passivation film 16 are formed. By carrying out any heating step after the Ti layer 10 is formed, only a contact portion 10a between the Ti layer 10 and the $N^+$ diffused layer is silicified as silicide This silicide portion serves to reduce the connection resistance between the Al wiring layer 14 and the $N^+$ diffused layer 6.

However, the conventional ferroelectric memory has the following problems. It is known that the ferroelectric thin film does not exhibit ferroelectricity at a certain high temperature. The reason is not necessarily clear. When the ferroelectric material is further heated, it does not return to its original state. In short, the ferroelectric material looses the ferroelectricity non-reversibly at a certain temperature or higher.

For this reason, in order to avoid the deterioration of the ferroelectric layer FL, the heating temperature for silicifying cannot be risen so high. On the other hand, at such a temperature, the titanium material cannot be silicified sufficiently. Namely, the Ti layer 10 at the contact portion 10a is not silicified sufficiently. As a result, the contact portion 10a between the Ti layer 10 and the $N^+$ diffused layer 6 has somewhat of property of a Schottky diode. Namely, the contact resistance does not become so low, and has also characteristic dependent on a voltage. This impede the high-speed response of the memory.

In order to solve such a problem, a technique of using a platinum (Pt) layer in place of the Ti layer 10 can be proposed. Since platinum is silicified at a lower temperature than titanium is, it can be silicified sufficiently at a temperature lower than the temperature when the ferroelectric layer FL is deteriorated.

However, since the platinum exhibits a strong reduction/catalysis function, if any step is thereafter effected within a reduction atmosphere, the reduction of the ferroelectric material which is an oxide is promoted owing to the presence of platinum not silicified. Thus, the ferroelectric material will be deteriorated. Therefore, after the silicifying step, the non-reacted platinum must be removed. However, the platinum cannot but be removed using aqua regia. It is difficult to effect such a step in a common semiconductor processing process.

SUMMARY OF THE INVENTION

An object of the present invention is to solve the problem described above and to provide a semiconductor device which can give a low connection resistance between a silicon layer and a wiring layer while keeping the function of a ferroelectric layer, and a method of manufacturing such a device.

The semiconductor device according to the first aspect of the present invention is characterized in that the silicide layer contains a silicide layer formed by silicifying at least one metal selected from the group consisting of cobalt (Co), iron (Fe), nickel (Ni), chromium (Cr) and molybdenum (Mo), which can be silicified at a temperature lower than the temperature when the ferroelectric layer is substantially deteriorated and has a substantially very weak reduction/catalysis function for the ferroelectric layer.

Therefore, without deteriorating the function of the ferroelectric layer, the metallic portion which is contact with the silicon layer can be sufficiently silicified. In addition, the metallic portion not silicified does not adversely affect the ferroelectric layer in the post manufacturing steps. Namely, while holding the function of the ferroelectric layer, the connection resistance between the silicon layer and wiring layer can be decreased.

The semiconductor device according to the second aspect of the present invention is characterized in that the silicide layer is made of a metal which is silicified at a temperature lower than the temperature when the wiring layer is substantially deteriorated.

Therefore, even when silicifying is effected after forming the wiring layer, the wiring layer will not be deteriorated. Therefore, it is not necessary to carry out the silicifying step before the step of forming the wiring layer. This increase the freedom of manufacturing steps and reduces the production cost.

The semiconductor device according to the third aspect of the present invention is characterized in that the silicide layer is formed by silicifying a metal which is silicified at a temperature lower than the temperature when a passivation film covering the wiring layer is formed. For this reason, the silicifying can be effected at the temperature when the passivation film is formed. Thus, no heating step dedicated for silicifying is required, thereby further restricting the production cost.

The semiconductor device according to the fourth aspect of the present invention is characterized in that the silicide layer is formed by silicifying a material which is specified in the eighth group—fourth cycle on the periodic table.

Since the metals specified in the eighth group—fourth cycle on the periodic table, i.e. iron, nickel and cobalt can be easily silicified, a silicide layer having low resistance can be formed without deteriorating the ferroelectric material.

Incidentally, iron (Fe) can be easily silicified by heating at 450–550 °C., for example Fe is heated at 450–550 °C. to be FeSi,and Fe is heated at 550° C. to be $FeSi_2$. The smaller the Atomic weight of the material of the eighth group cycle on the periodic table, the smaller the catalysis effect. Nickel (Ni) can be easily silicified by heating at 200–350 °C. to be $Ni_2Si$, is heated at 350–700° C. to be NiSi, and is heated at 775 °C. to be $NiSi_2$. And a resistivity of the $NiSi_2$ is about 35.8 Ωcm. Catalysis function is small next of Fe.

Further, cobalt (Co) can be easily silicified by heating at 350–500° C. to be $Co_2Si$, whose resistivity is about 18 Ωcm, at 550 °C. to be CoSi, whose resistivity is about 18 Ω cm.

The semiconductor device according to a fifth aspect of the present invention is characterized in that said slicide layer is any one of a nickel silicide layer, cobalt silicide layer and iron silicide layer.

The semiconductor device according to the sixth aspect of the present invention is characterized in that the silicide layer is formed by silicifing a material made of a at least one metal selected from the group consisting of cobalt (Co), iron (Fe), nickel (Ni), chromium (Cr) and molybdenum (Mo), doped with a manganese (Mn) or magnesium (Mg). Cobalt (Co), iron (Fe), nickel (Ni), chrome (Cr) or molybdenum (Mo), when it is doped with a manganese (Mn) or magnesium (Mg), can be silicified at a lowered temperature.

The semiconductor device according to the seventh aspect of the present invention is characterized in that the silicide layer is formed by the silicifying at least one metal selected from the group consisting of tungsten (W), rhenium (Re), titanium (Ti) and iridium (Ir), doped with manganese (Mn) or magnesium (Mg). Tungsten, which is a refractory metal, is difficult to be silicified as an element. However, when it is doped with manganese or magnesium, it can be easily silicified. The tungsten silicide is very stable to have low resistivity, thereby providing a contact structure with high reliability. Further, rhenium (Re) is easy to be machined.

Titanium (Ti) can be used without changing from the conventional process not so much and without being accompanied with any risk. Iridium, which can be used as an electrode of Ferroelectric memory device, can be deposited in the same step.

The semiconductor device according to the eighth aspect of the present invention is characterized in that the wiring layer is a layer containing aluminum (Al). Although aluminum (Al) can be easily deposited at low cost, it is likely to be easily deteriorated at a combatively low temperature. The contact containing cobalt (Co), iron (Fe), nickel (Ni), chrome (Cr) or molybdenum (Mo), which can be silicified at a comparatively low temperature, can be formed without deteriorating the aluminum wiring layer, thus providing a semiconductor device with high reliability.

The semiconductor device according to the ninth aspect of the present invention is characterized in that the passivation film is an insulating film including a silicon nitride layer. The passivation film containing a silicon nitride film must be deposited within a reduction atmosphere. However, since the metal used for the silicide layer does not serve as reduction catalyst unlike platinum (Pt), the ferroelectric film can be maintained preferably, thereby providing a semiconductor device with high reliability.

The semiconductor device according to the tenth aspect of the present invention is characterized by comprising: a semiconductor substrate with a MOSFET formed in its surface; a ferroelectric capacitor with a ferroelectric film serving as a capacitor insulating film formed on the surface of the semiconductor substrate so as to be brought into contact with one of source/drain regions of the MOSFET; and a wiring layer formed on the semiconductor substrate through an interlayer insulating film so as to provide a contact region electrically connected to a silicon layer constituting the other of the source/drain regions, and in that the contact region includes a silicide layer intervening between said silicon layer and said wiring layer and made of at least one metal selected from the group consisting of cobalt (Co), iron (Fe), nickel (Ni), chrome (Cr) and molybdenum (Mo). This configuration can provide a ferroelectric memory (FeRAM) with high reliability which gives low contact resistance and preferably maintains the ferroelectric film.

The semiconductor device according to the present invention is also characterized in that the silicide layer is made of the metal which can be removed a corrosive agent generally used in a semiconductor manufacturing process. Therefore, the non-silicified portion of the metal portion can be easily removed by a general corrosion agent as occasion demands.

The method of manufacturing a semiconductor device according to the eleventh aspect of the present invention is characterized in that a metallic layer, which can be easily silicified at a temperature lower than the temperature when the ferroelectric layer is substantially deteriorated and has a very weak reduction/catalysis function, is formed so as to be partially in contact with the upper surface of the silicon layer, and the metallic layer is heated at the temperature lower than the temperature when the ferroelectric layer is substantially deteriorated so that it is silicified to provide a silicide layer. Specifically, the method of manufacturing a semiconductor device according to the eleventh aspect of the present invention is characterized by comprising the steps of: forming an element region inclusive of a silicon layer in a surface of a semiconductor substrate; forming a ferroelectric layer formed on the surface of the semiconductor substrate with the element region formed therein through a first interlayer insulating film; forming a second interlayer insulating film; forming a contact hole in the first and second interlayer insulating films so as to reach said silicon layer; forming a metallic layer containing at least one metal selected from the group consisting of cobalt (Co), iron (Fe), nickel (Ni), chromium (Cr) and molybdenum (Mo) on at least the surface of the silicon layer exposed to the contact hole; forming a conductive layer on the metallic layer and patterning it to provide a wiring layer; and silicifying the metallic layer to form a silicide layer by heating the metallic layer before or after providing the wiring layer at a temperature lower than the temperature at which the ferroelectric layer is substantially deteriorated.

Therefore, without deteriorating the function of the ferroelectric layer, the metallic portion which is contact with the upper surface of the source/drain region can be sufficiently silicified. In addition, the metallic portion not silicified does not adversely affect the ferroelectric layer in the post manufacturing steps. Namely, without damaging the function of the ferroelectric layer, the connection resistance between the silicon layer and wiring layer can be decreased.

The method of manufacturing a semiconductor device according to the twelfth aspect of the present invention is characterized in that the silicifying step is to heat the metallic layer, after the wiring layer is formed, at a temperature lower than the temperature when the ferroelectric layer is substantially deteriorated. For this reason, the wiring layer will not be deteriorated owing to heat in the silicifying step. Therefore, it is not necessary to carry out the silicifying step before the step of forming the wiring layer. This increase the freedom of manufacturing steps and reduces production cost.

The method of manufacturing a semiconductor device according to the thirteenth aspect of the present invention is characterized in that the silicifying step is to heat the metallic layer, after the wiring layer is formed. at a temperature lower than 450° C. For this reason, the ferroelectric layer will not be deteriorated.

The method of manufacturing a semiconductor device according to the fourteenth aspect of the present invention is characterized in that it further comprises a step of forming a passivation film on the surface of the semiconductor substrate with the wiring layer formed therein, and the silicifying step is effected by heating for forming the passivation film. Namely, the method of manufacturing a semiconductor device according to this aspect is characterized in that after the wiring layer is formed, the passivation film covering it is formed, and the metal layer is silicified using heat when the passivation film is formed. For this reason, the metallic layer can be silicified with no heating step dedicated for silicifying so that the number of times of heating the ferroelectric layer can be reduced. This improves the quality of the ferroelectric memory and reduces the production cost.

The method of manufacturing a semiconductor device according to the fifteenth aspect of the present invention is characterized in that the silicifying step includes steps of: before forming the wiring layer, silicifying the metallic layer at a temperature lower than the temperature when the ferroelectric layer is substantially deteriorated, and selectively etching away a non-silicified portion of the metallic layer. Therefore, the non-silicified metal portion can be easily removed using a general corrosive agent.

The method of manufacturing a semiconductor device according to the sixteenth aspect of the present invention is characterized in that the step of forming the metallic layer is; to form a material layer made of at least one metal selected from the group consisting of cobalt (Co), iron (Fe), nickel (Ni), chromium (Cr) and molybdenum (Mo), doped with a manganese (Mn) or magnesium (Mg) on the surface of the semiconductor substrate. Cobalt (Co), iron (Fe), nickel (Ni), chrome (Cr) or molybdenum (Mo), when it is doped with a manganese (Mn) or magnesium (Mg), can be silicified at a lowered temperature.

The method of manufacturing a semiconductor device according to the seventeenth aspect of the present invention is characterized in that the step of forming the metallic layer is to form a material layer made of at least one metal selected from the group consisting of tungsten (W), rhenium (Re), titanium (Ti) and iridium (Ir), doped with manganese (Mn) or magnesium (Mg). Such a metal is difficult to be silicified as an element. However, when it is doped with manganese or magnesium it can be easily silicified, thereby providing a contact structure with high reliability The method of manufacturing a semiconductor device according to the eighteenth aspect of the present invention is characterized in that the silicifying step is to heat the metallic layer at 450° C. or lower. For this reason, without deteriorating the ferroelectric layer, the metallic layer can be silicified, thus providing the ferroelectric memory with high reliability.

The method of manufacturing a semiconductor device according to the nineteenth aspect of the present invention is characterized in that the step of forming the wiring layer is to form a layer containing aluminum. Although aluminum (Al) can be easily deposited at low cost, it is likely to be easily deteriorated at a combatively low temperature. The contact containing cobalt (Co), iron (Fe), nickel (Ni), chromium (Cr) or molybdenum (Mo), which can be silicified at a comparatively low temperature, can be formed without deteriorating the aluminum wiring layer, thus providing a semiconductor device with high reliability.

The method of manufacturing a semiconductor device according to the twentieth aspect of the present invention is characterized in that the step of forming the passivation film is to form a silicon nitride film by sputtering within a nitrogen atmosphere. Within the nitrogen atmosphere which is a reduction atmosphere, the metal used for the silicide layer in the present invention does not serve as reduction catalyst unlike platinum (Pt). Thereafter, the ferroelectric film can be maintained preferably, thereby providing a semiconductor device with high reliability.

In each of the respective aspects of the present invention, the concept of forming a certain layer (e.g. silicon layer) "on a semiconductor substrate" includes to form a certain layer in contact with the semiconductor substrate, to form a certain layer on another layer(s) formed on the semiconductor substrate, and to form a certain layer which is the semiconductor substrate itself.

The above and other objects and features of the present invention will be more apparent from the following description taken in conjunction with the accompanying drawings.

DESCRIPTION OF THE PREFERRED EMBODIMENTS

Embodiment 1

Figure 1:
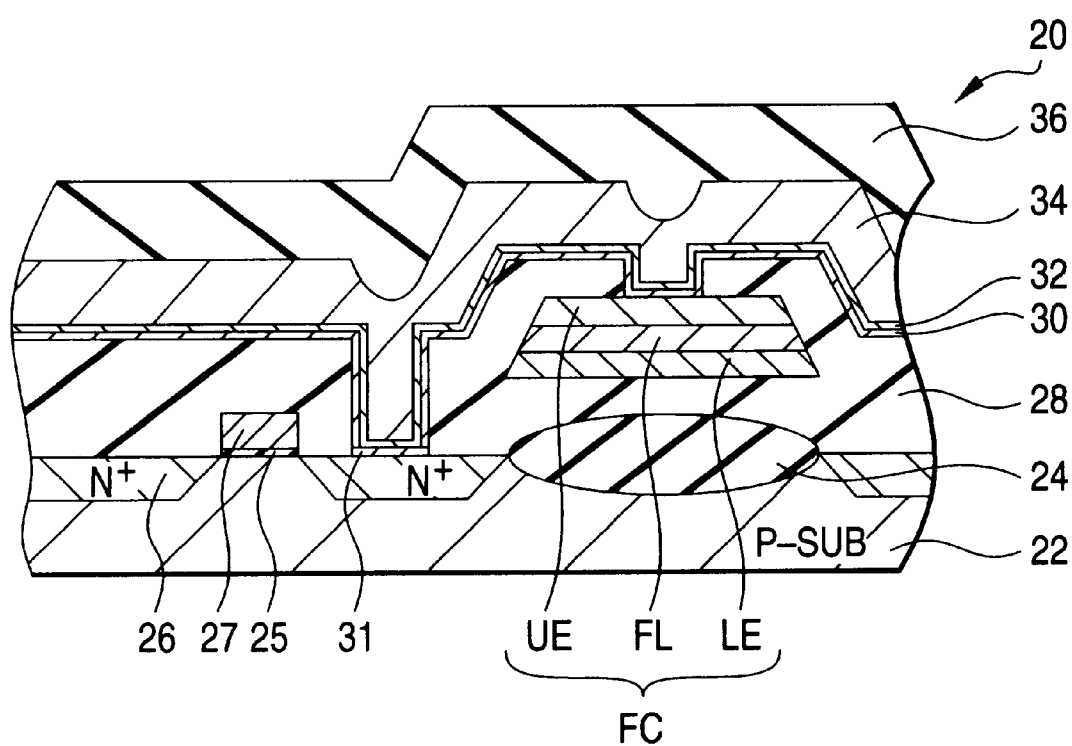
FIG. 1 is a sectional view for explaining a ferroelectric memory 20 which is a semiconductor device according to a first embodiment of the present invention.

FIG. 1 shows a portion of the sectional structure of a ferroelectric memory (FeRAM) 20 which is a semiconductor device according to an embodiment of the present invention. The ferroelectric memory 20 includes a ferroelectric capacitor FC and an MOSFET. In this structure, in order to prevent the deterioration of a ferroelectric film, the contact region corresponding to a storage node contact is constructed of a nickel silicide which is formed by heating a nickel layer 30 at 400° C.

Specifically, a field oxide film 24 for element isolation of silicon oxide is formed at a prescribed position on a semiconductor substrate 22 made of P-type Si. A gate electrode 27 of a poly-Si film is formed through a gate insulating film 25 within an element region sectioned by the field oxide film 24. $N^+$ diffused layers 26 which serve as source/drain regions are formed so as to sandwich the gate electrode 27, thereby constituting a MOSFET.

Incidentally, in FIGS. 2–7 showing manufacturing steps, for convenience of illustration, only the N+ diffused layer (source or drain region which is an $N^+$ Si layer) 26 of the MOSFET is shown.

On the field oxide film 24 and MOSFET, an interlayer insulating film 28 of silicon oxide is formed. A ferroelectric capacitor FC is formed so that it is embedded in the interlayer insulating film 28. The ferroelectric capacitor FC has a structure composed of a lower electrode LE serving as a plate electrode, a ferroelectric layer FL of PZT (PbZr$_x$Ti$_{1-x}$O$_3$) and an upper layer connected to one of the source/drain regions of the MOSFET and serving as a storage node, which are stacked in this order.

The material of the lower electrode L and upper electrode UE is not particularly limited, but may be an iridium oxide or iridium itself. The electrode having a stacked structure of these materials may be adopted. Although not shown in FIG. 2, a contact region is further formed, and a wiring electrode through which a voltage is applied to the lower electrode is also formed.

On the interlayerinsulating film 28 are formed a metallic layer 30 of Ni having a thickness of 30 nm, a barrier metal layer 32 of e.g. TiN having a thickness of 10 nm and an aluminum wiring layer 34 of aluminum-silicon-copper (Al—Si—Cu) alloy, which are stacked in this order. The portion of the metallic layer 30 which is in contact with the N+ diffused layer 26 is silicified as a silicide layer 31. As described later, the silicide layer 31 is sufficiently silicified. Therefore, the contact resistance between the aluminum-wiring layer 34 and the N+ diffused layer 26 is very low. Although not shown in this figure, in the other region of the source/drain regions of the MOSFET, the same contact is formed to which a bit line is connected. The upper surface of the aluminum wiring layer 34 is covered with a passivation film (protection film) 36 which is composed of two films of a silicon nitride film and a silicon oxide film.

Figure 2:
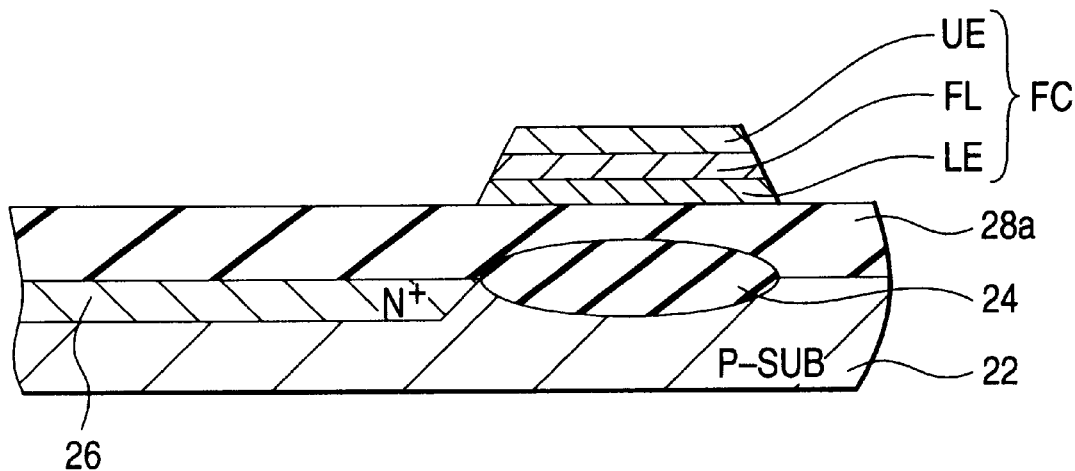
FIGS. 2–7 are sectional views for explaining a method of manufacturing the ferroelectric memory 20.

Now referring to FIGS. 2–7, an explanation will be given of a method of manufacturing the ferroelectric memory 20. First, as shown in FIG. 2, a field oxide film 24 for element isolation is formed. The field oxide film 24 can be formed by e.g. a LOCOS (Local Oxidation of Silicon) technique.

A MOSFET is formed within an element region sectioned by the field oxide film 24. As described above, in FIGS. 2–7, for convenience of illustration, only the N$^+$ diffused layer 26 of the MOSFET is shown. On the field oxide film 24 and MOSFET, silicon oxide is deposited to form an interlayer insulating film 28a.

On the interlayer insulating film 28a, a ferroelectric capacitor FC is formed. The ferroelectric capacitor FC is formed as follows. First, on the interlayer insulating film 28a, a conductor layer serving as a lower electrode LE is formed by e.g. sputtering technique. Further, a layer serving as a ferroelectric layer FL is formed thereon by e.g. sol/gel technique or the sputtering technique. A conductor layer serving as an upper electrode UE is formed further thereon by e.g. sputtering technique. Thereafter, these three layers formed on the interlayer insulating film 28a are patterned by etching to form the ferroelectric capacitor FC as shown in FIG. 2.

Figure 3:
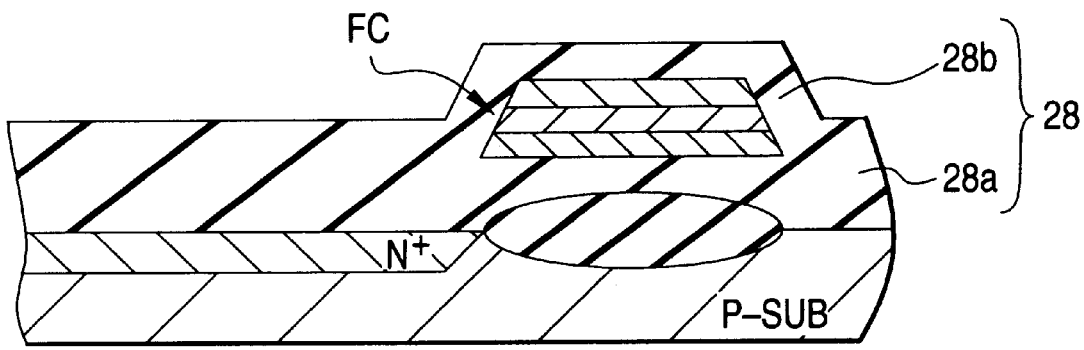

As shown in FIG. 3 on the ferroelectric capacitor FC, silicon oxide is deposited to form an interlayer insulating film 28b. Thus, the ferroelectric capacitor FC is surrounded by the interlayer insulating film 28a and interlayer insulating film 28b. Both interlayer insulating films 28a and 28b refer to an interlayer insulating film 28.

Figure 4:
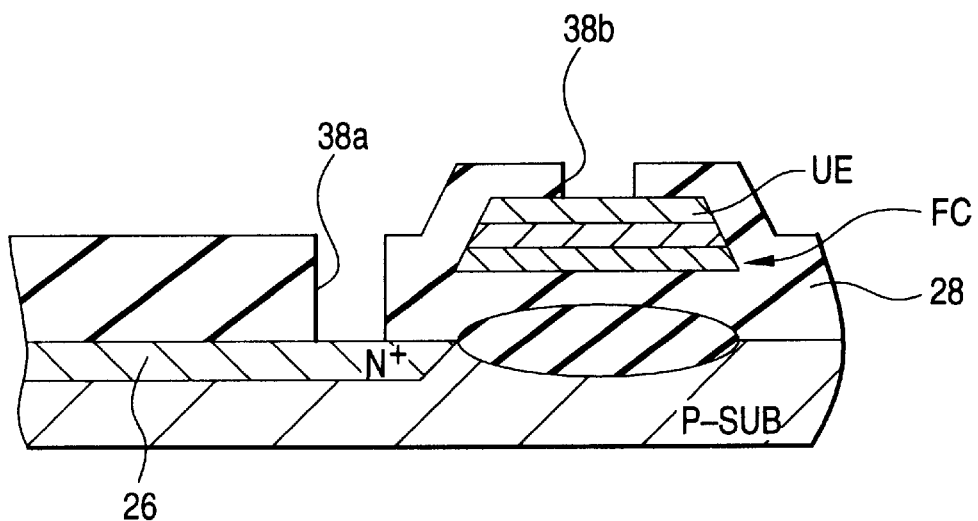

As shown in FIG. 4, by etching, contact holes 38a and 38b are formed in the interlayer insulating film 28. The contact hole 38a is formed so as to reach the N$^+$ diffused layer 26. The contact hole 38b is formed so as to reach the upper electrode UE of the ferroelectric capacitor FC.

Figure 5:
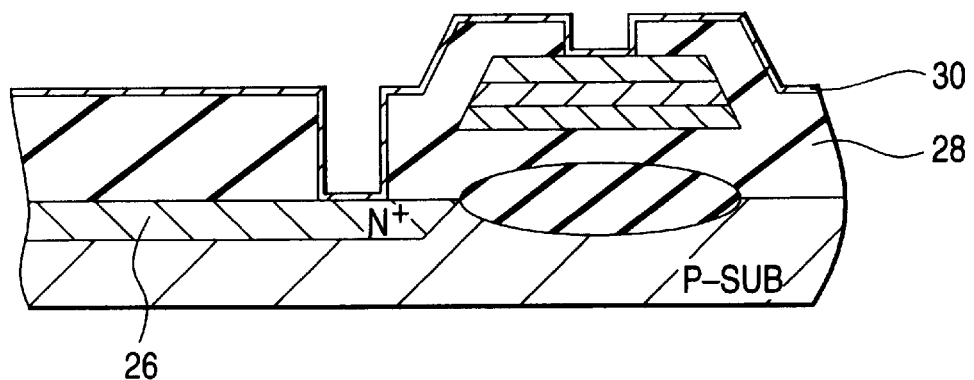

As shown in FIG. 5, by the sputtering or vacuum deposition technique, a metallic layer 30 of Ni is formed on the resultant surface. Since the silicide layer 31 may be thin, the metallic layer 30 is made as thin as possible so that the amount of the non-reacted nickel is preferably as little as possible. In this embodiment, the film thickness of the metallic layer 30 is set at about 300 A.

Figure 6:
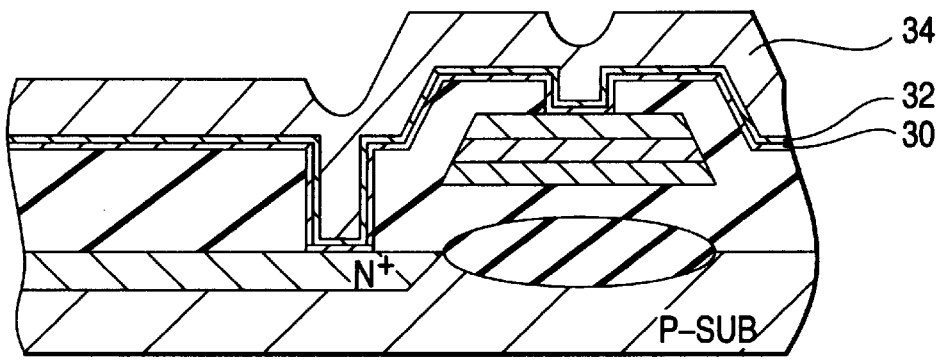

As shown in FIG. 6, by the sputtering technique for example, a barrier metal layer 32 of e.g. TiN having a thickness of 10 nm and an aluminum wiring layer 34 of aluminum-siliconcopper (Al—Si—Cu) alloy are formed so that they are stacked on the metallic layer 30. Further, by photolithography, these three layers are patterned in a predetermined wiring shape.

Figure 7:
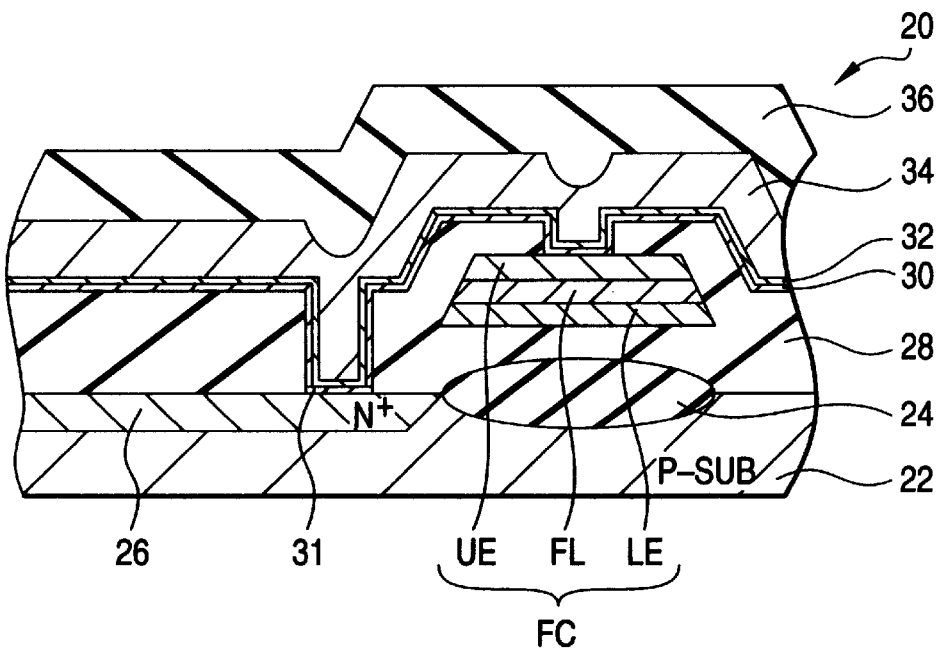

Finally, as shown in FIG. 7, by the sputtering technique, on the aluminum wiring layer 34, a passivation film 36 composed of two layers of a silicon nitride film and a silicon oxide film is formed. During the deposition of the passivation film 36, the substrate is heated at 400° C. Even when the substrate is heated at such a temperature, the ferroelectric layer FL will not loose the ferroelectricity non-reversibly. The aluminum layer 34 will not be deteriorated.

Owing to the heat applied at this time, a portion of the metallic layer 30 which is in contact with Si is silicified. Specifically, the contact portion between the N$^+$ diffused layer 26 of Si and the metallic layer of Ni and its neighborhood are silicified owing to heat to form the silicide layer 31.

Unlike Ti or others, Ni can be sufficiently silicified at a temperature lower than the temperature when the passivation film 36 is formed. Therefore, as described above, the connection resistance of the aluminum wiring layer 34 and N$^+$ diffused layer 26 is very low.

Unlike platinum (Pt), Ni has a very weak reduction/catalysis function. Therefore, even when the passivation film 36 as shown in FIG. 7 is formed within a reduction atmosphere, the metallic layer left in a non-reacted state does not promote the reduction reaction for the ferroelectric layer FL.

The metallic layer 30 in contact with the upper electrode UE of the ferroelectric capacitor FC is not silicified. However, since both upper electrode UE and metallic layer 30 are made of metal, no Schottky junction is formed at the contact portion therebetween and contact resistance is low. Therefore, no problem occurs.

As described above, in this embodiment, the metallic layer 30 of Ni, which is silicified at the temperature (about 350° C. for Ni) lower than the temperature (about 450° C. in this embodiment) when the ferroelectric layer FL looses ferroelectricity non-reversibly and has a very weak reduction/catalysis function, is formed so as to be partially brought into contact with the upper surface of one of the source/drain regions 26. Thereafter, the metallic layer 30 is heated at the temperature (about 400° C. in this embodiment) lower than the temperature when the ferroelectric layer FL looses the ferroelectricity non-reversibly. Thus, the metallic layer 30 is silicified to form the silicide layer 31.

Therefore, without deteriorating the function of the ferroelectric layer FL, the portion of the metallic layer 30 which is contact with the upper surface of the source/drain region 26 can be sufficiently silicified. In addition, the metallic layer 30 not silicified does not adversely affect the ferroelectric layer FL in the post manufacturing steps. Namely, without damaging the function of the ferroelectric layer FL, the connection resistance between the source/drain region 26 and aluminum-wiring layer 34 can be decreased.

In this embodiment, after the metallic layer 30 is formed, the aluminum-wiring layer 34 is formed. Thereafter, the metallic layer 30 is silicified at the temperature (about 400°

C.) lower than the temperature (e.g. melting point of the material of the aluminum wiring layer 34) when the aluminum wiring layer 34 is deteriorated.

For this reason, the aluminum-wiring layer will not be deteriorated owing to heat in the silicifying step. Therefore, it is not necessary to carry out the silicifying step before the step of forming the aluminum-wiring layer 34. This increases the freedom of manufacturing steps and reduces the production cost.

Further, in this embodiment, the metallic layer 30 is silicified using the heat (about 400 °C. in this embodiment) when the passivation film 36 covering the aluminum-wiring layer 34 is formed. For this reason, the metallic layer 30 can be silicified with no heating step dedicated for silicifying. Thus, the production cost can be further restricted.

It should be noted that the present invention is not limited to the manufacturing method of silicifying the metallic layer 30 using the heat when the passivation film 36 covering the aluminum wiring layer 34 is formed. For example, the metallic layer 30 maybe silicified before the passivation film 36 is formed. In this case, the metallic layer 30 can be sufficiently silicified at a desired temperature even if the temperature when the passivation film 36 is formed is not enough to silicify the metallic layer 30.

In this embodiment, the silicifying is carried out after the aluminum-wiring layer 34 is formed. However, the present invention should not be limited to such a procedure. The silicifying may be carried out before the aluminum-wiring layer 34 is formed. In this case, the metallic layer 30 can be silicified at the temperature higher than the temperature when the aluminum-wiring layer 34 is deteriorated.

Embodiment 2

Figure 13:
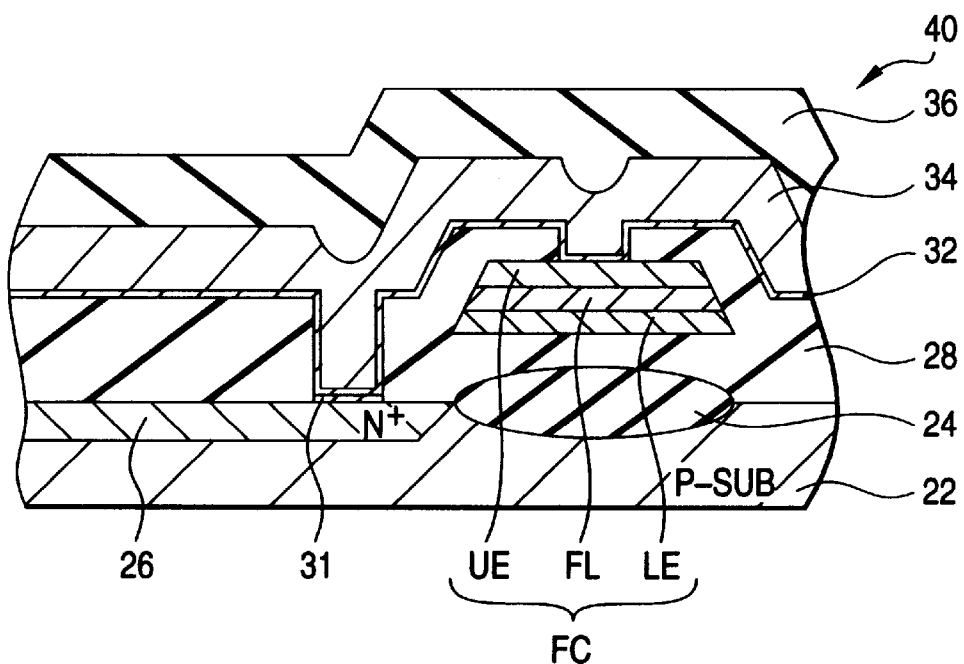
Figure 14:
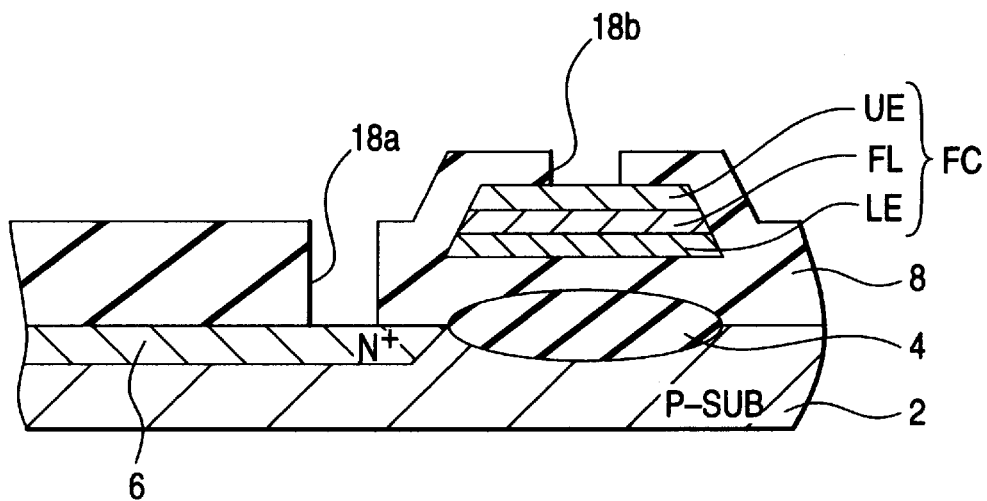
FIGS. 14–15 are sectional views for explaining a method of manufacturing a conventional ferroelectric memory.
Figure 15:
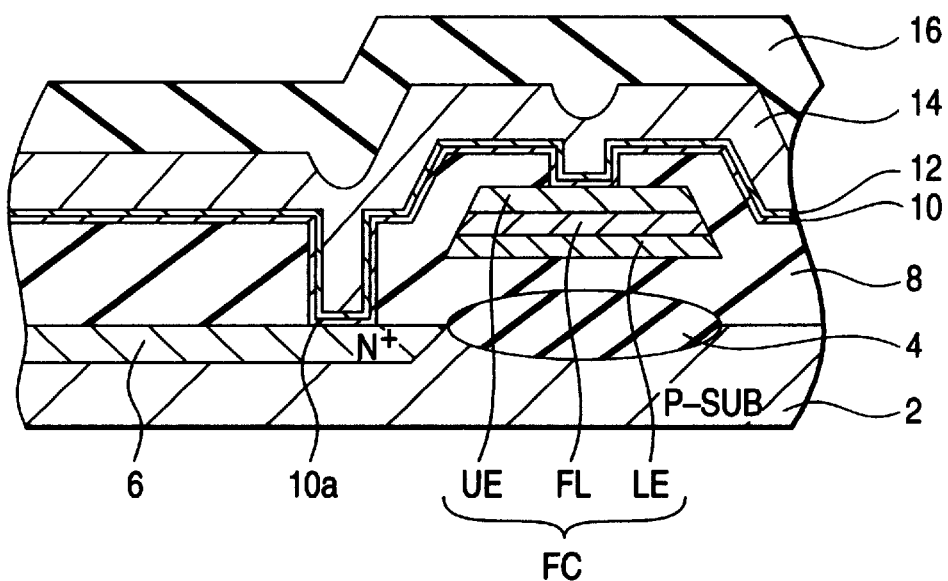

FIG. 13 shows a portion of the sectional structure of a ferroelectric memory 40 which is a semiconductor device according to another embodiment of the present invention. The ferroelectric memory 40 has a structure similar to the ferroelectric memory 20 as shown in FIG. 7, but is different from the ferroelectric memory 20 in that the non-reacted metallic layer 30 is removed.

Figure 8:
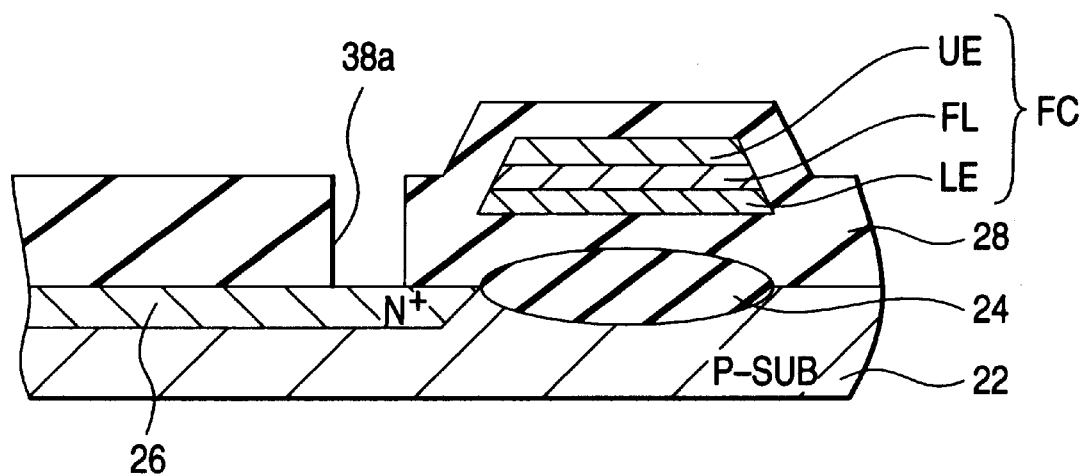
FIGS. 8–13 are sectional view for explaining a method of manufacturing a ferroelectric memory 40 which is a semiconductor device according to a second embodiment of the present invention.

Now referring to FIGS. 8–13, an explanation will be given of a method of manufacturing the ferroelectric memory 40. The half of the manufacturing process is the same as the steps shown in FIGS. 2 and 3. Next, as shown in FIG. 8, by etching, a contact hole 38a is formed in the interlayer insulating film 28. The contact hole 38a is formed to reach the $N^+$ diffused layer 26. Incidentally, unlike the embodiment described previously, at this time, the contact hole 38b (FIG. 4) is not formed.

Figure 9:
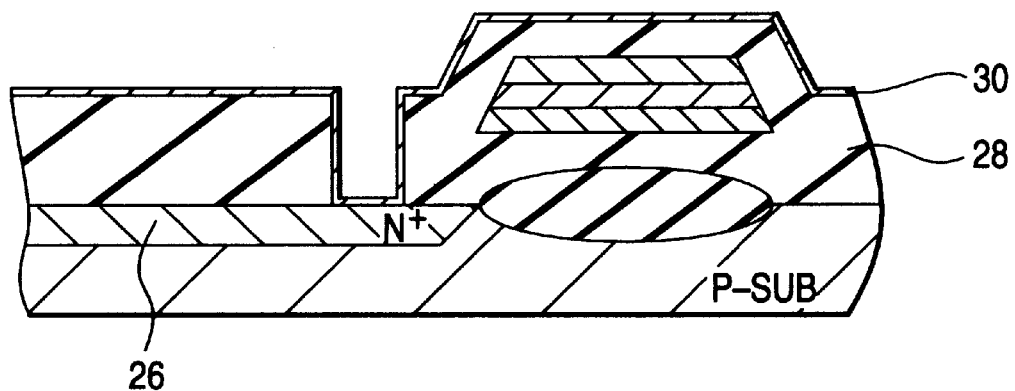

On the resultant surface, as shown in FIG. 9, a metallic layer 30 of a manganese-containing Ni is formed by the sputtering technique. In this case, Ni containing manganese of 20% by weight is used as a target. In this embodiment also, the film thickness of the metallic layer 30 is set at about 30 nm.

Figure 10:
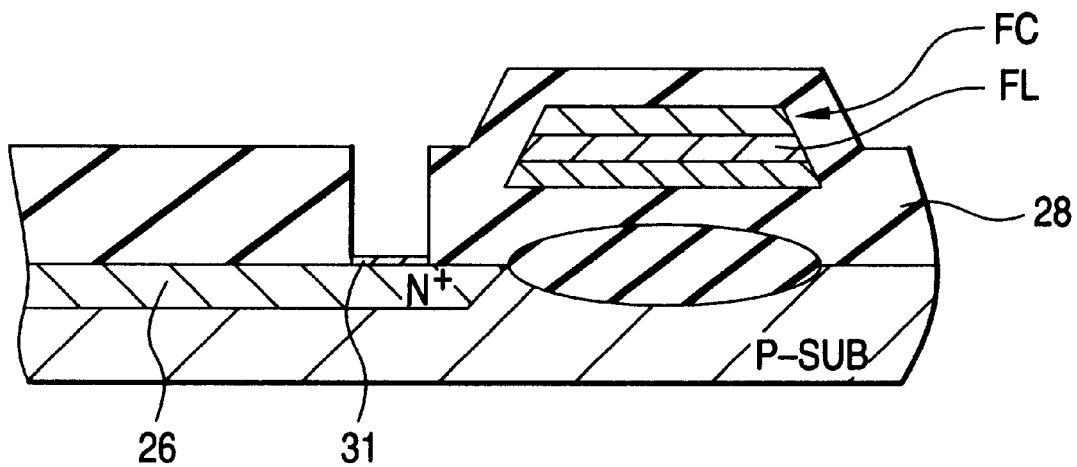

The metallic layer 30 is heat-treated at a temperature of 380° C. so that a portion of the metallic layer 30 which is in contact with Si is silicified. Specifically, the contact portion between the $N^+$ diffused layer 26 of Si and metallic layer 30 is sufficiently silicified owing to heat to form the silicide layer (FIG. 10). Like the previous embodiment, owing to the heat of such a order of temperature, the ferroelectric layer FL does not loose the ferroelectricity non-reversibly.

The non-reacted metallic layer 30 left without being ilicified is removed using a corrosion solution such as a mixed solution of sulfuric acid, hydrogen peroxide and pure water or a mixed solution of ammonia, sulfuric acid and pure water, which is generally used in a semiconductor manufacturing process. FIG. 10 shows the state after the non-reacted metallic layer 30 is removed.

Figure 11:
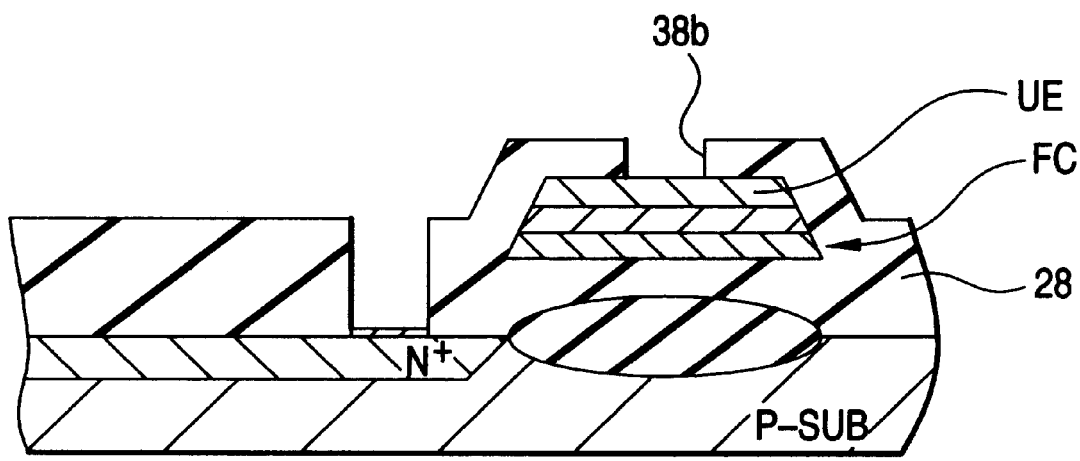

Next, as shown in FIG. 11, by etching, a contact hole 38b is formed in the interlayer insulating film 28. The contact hole 38b is formed to reach the upper electrode UE of the ferroelectric capacitor FC.

Figure 12:
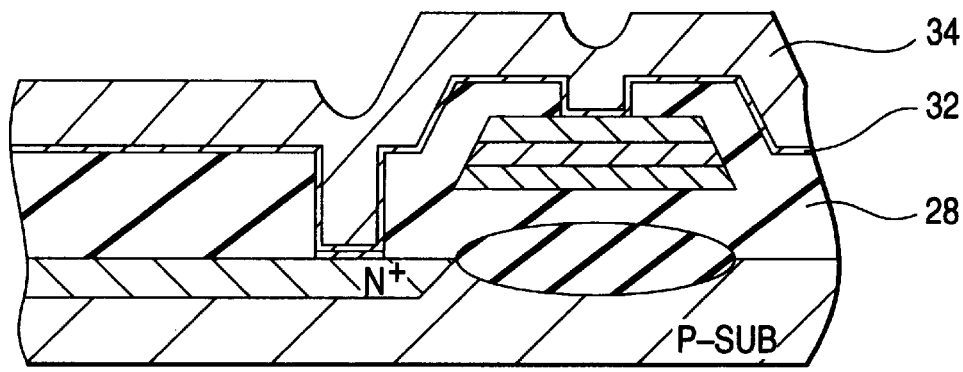

As shown in FIG. 12, a barrier metal layer 32 of e.g. TiN and an aluminum wiring layer 34 of aluminum-silicon-copper (Al—Si—Cu) alloy are formed. Further, these two layers are patterned in a predetermined wiring shape. Finally, as shown in FIG. 13, a passivation film 36 is formed on the aluminum-wiring layer 34.

In this embodiment, after the metallic layer 30 is formed, it is silicified at the temperature lower than the temperature when the ferroelectric layer FL is deteriorated. Thereafter, the non-silicified portion of the metallic layer 30 is removed using the above mixed solution which is generally used in the semiconductor manufacturing process. Finally, the aluminum-wiring layer 34 is formed.

Therefore, where it is necessary to remove the non-silicified metallic layer 30, e.g. the coupling force between the metallic layer 30 and the interlayer insulating film 28 is small, the non-reacted metallic layer 30 can be easily removed using a general corrosion agent.

In this embodiment, the metallic layer of manganese-containing nickel was used as the metallic layer 30 so that the silicifying temperature may be comparatively low. In the embodiments described above, the metallic layer was made of Ni or Mn-containing Ni, but should not be limited to such a material. The contents of Mn is preferably 45% by weight from the standpoint of both contact resistance and silicifying temperature. It is more preferably 10–30% by weight.

Further, the film thickness of the metallic layer is preferably the degree of a single atomic layer to about 100 nm. It is more preferably 20–40 nm so that the metallic layer can be silicified more completely.

Further, the metallic layer may be made of not only Ni but also cobalt (Co) or iron (Fe) which is specified in the eighth group—fourth cycle on the periodic table, or may be the other material.

These materials may be used in the form of not only an element, but of an alloy. For example, each of these materials may be used in the form of their alloy with Mn or Mg. Addition or doping of Mn or Mg to each of the above materials further promotes the silicifying. The material of tungsten (W), rhenium (Re), titanium (Ti) or iridium (Ir) used in the form of its alloy with Mn or Mg also promotes the silicifying.

In each of the embodiments described above, the ferroelectric layer was made of PZT, but should not be limited to it. The ferroelectric layer may be made of PLZT which is PZT ontaining lanthanum (La) or PNZT which is PZT containing niobium (Nb). The ferroelectric layer may be also made of SBT.

In each of the embodiments described above, the wiring layer was explained as the aluminum-wiring layer 34 of aluminum-silicon-copper (Al—Si—Cu) alloy. The wiring layer should not be limited to such an aluminum layer. The wiring layer may be a metallic layer of aluminum-silicon (Al—Si) alloy or aluminum only. The wiring layer may be a metallic layer of gold (Au) or copper (Cu) not containing aluminum, and further a non-metallic layer of non-metal such as polysilicon.

In each of the embodiments described above, the barrier metal layer 32 was formed below the aluminum-wiring layer 34. However, where such a barrier metal layer may be omitted. For example, the wiring layer is made of tungsten (W) which does not diffuse into the surroundings as impurities, the barrier metal layer 32 is not required.

In each of the embodiments described above, the semiconductor device was explained as the ferroelectric memory. However, the present invention should not be limited to the ferroelectric memory. The present invention can be applied to a general semiconductor device having a ferroelectric layer such as a ferroelectric memory having an MIS structure in which the ferroelectric film is used as the gate insulating film of an FET.

What is claimed is:

1. A semiconductor device comprising:

a semiconductor substrate with an element region inclusive of a silicon layer formed in its surface;

a ferroelectric layer formed on the surface of the semiconductor substrate; and a wiring layer formed on said semiconductor substrate through an interlayer insulating film so as to provide a contact region electrically connected to said silicon layer, wherein said contact region includes a silicide layer intervening between said silicon layer and said wiring layer and made of silicide of at least one metal selected from the group consisting of cobalt (Co), iron (Fe), nickel (Ni), chromium (Cr) and molybdenum (Mo), doped with manganese (Mn) or magnesium (Mg).

2. A semiconductor device according to claim 1, wherein said silicide layer is formed by silicifying a metal which can be silicified at a temperature lower than the temperature when said wiring layer is substantially deteriorated.

3. A semiconductor device according to claim 2, wherein said silicide layer is formed by silicifying a metal which can be silicified at a temperature lower than the temperature when a passivation film covering said wiring layer is formed.

4. A semiconductor device according to claim 1, wherein said wiring layer is a layer containing aluminum (Al).

5. A semiconductor device according to claim 3, wherein said passivation film is an insulating film including a silicon nitride layer.

6. A semiconductor device comprising:

a semiconductor substrate with a MOSFET formed in its surface;

a ferroelectric capacitor with a ferroelectric film serving as a capacitor insulating film formed on the surface of said semiconductor substrate so as to be brought into contact with one of source/drain regions of said MOSFET; and a wiring layer formed on said semiconductor substrate through an interlayering insulating film so as to provide a contact region electrically connected to a silicon layer constituting the other of said source/drain regions, wherein said contact region includes a silicide layer intervening between said silicon layer and said wiring layer and made of at least one metal selected from the group consisting of cobalt (Co), iron (Fe), nickel (Ni), chromium (Cr) and molybdenum (Mo), doped with manganese (Mn) or magnesium (Mg).

7. A semiconductor device comprising:

a semiconductor substrate with an element region inclusive of a silicon layer formed in its surface;

a ferroelectric layer formed on the surface of the semiconductor substrate; and a wiring layer formed on said semiconductor substrate through an interlayer insulating film so as to provide a contact region electrically connected to said silicon layer, wherein said contact region includes a silicide layer intervening between said silicon layer and said wiring layer and made of silicide of at least one metal selected from the group consisting of tungsten (W), rhenium (Re), titanium (Ti) and iridium (Ir), doped with manganese (Mn) or magnesium (Mg).

8. A semiconductor device according to claim 7, wherein said silicide layer is formed by silicifying a metal which can be silicified at a temperature lower than the temperature when said wiring layer is substantially deteriorated.

9. A semiconductor device according to claim 8, wherein said silicide layer is formed by silicifying a metal which can be silicified at a temperature lower than the temperature when a passivation film covering said wiring layer is formed.

10. A semiconductor device according to claim 7, wherein said wiring layer is a layer containing aluminum (Al).

11. A semiconductor device according to claim 9, wherein said passivation film is an insulating film including a silicon nitride layer.

12. A semiconductor device comprising:

a semiconductor substrate with a MOSFET formed in its surface;

a ferroelectric capacitor with a ferroelectric film serving as a capacitor insulating film formed on the surface of said semiconductor substrate so as to be brought into contact with one of source/drain regions of said MOSFET; and a wiring layer formed on said semiconductor substrate through an interlayer insulating film so as to provide a contact region electrically connected to a silicon layer constituting the other of said source/drain regions, wherein said contact region includes a silicide layer intervening between said silicon layer and said wiring layer and made of at least one metal selected from the group consisting of tungsten (W), rhenium (Re), titanium (Ti) and iridium (Ir), doped with manganese (Mn) or magnesium (Mg).

* * * * *